United States Patent [19]
Kinerk et al.

[11] Patent Number: 5,486,824
[45] Date of Patent: Jan. 23, 1996

[54] DATA PROCESSOR WITH A HARDWARE KEYSCAN CIRCUIT, HARDWARE KEYSCAN CIRCUIT, AND METHOD THEREFOR

[75] Inventors: Keith E. Kinerk; Hoang K. Quan; Joseph P. Magliocco, all of Austin, Tex.

[73] Assignee: Motorola, Inc., Schumburg, Ill.

[21] Appl. No.: 318,301

[22] Filed: Oct. 5, 1994

[51] Int. Cl.⁶ ..................................................... H03K 17/94
[52] U.S. Cl. ................................ 341/26; 341/24; 341/25; 364/189; 340/825.77
[58] Field of Search ................................. 341/24, 25, 26; 364/189, 709.12, 707; 340/825.77, 825.78, 825.79

[56] References Cited

U.S. PATENT DOCUMENTS

| | | | |
|---|---|---|---|
| 4,305,065 | 12/1981 | Mogi | 341/26 |
| 4,348,670 | 9/1982 | DeShon | 340/825.78 |
| 4,408,191 | 10/1983 | Fowler | 341/26 |
| 4,409,665 | 10/1983 | Tubbs | 364/707 |
| 4,922,248 | 5/1990 | Shiga | 341/25 |
| 5,101,201 | 3/1992 | Choi | 341/26 |
| 5,254,989 | 10/1993 | Verrier et al. | 341/26 |
| 5,264,845 | 11/1993 | Kwon et al. | 341/26 |
| 5,280,283 | 1/1994 | Raasch et al. | 341/26 |
| 5,384,721 | 1/1995 | Joto | 341/26 |

FOREIGN PATENT DOCUMENTS 092009143  5/1992  United Kingdom .............. 341/26

OTHER PUBLICATIONS

MC68HCO5PG&E Specification Revision 1.0, Section 4.1.3 Keyboard Scanner, pp. 31–33.
MC68HC05HG Release 1.4, Section 5 Input/Output Ports, pp. 37–47.

*Primary Examiner*—John K. Peng
*Assistant Examiner*—Ashok Mannava
*Attorney, Agent, or Firm*—Paul J. Polansky

[57] ABSTRACT

A data processor (50) includes a hardware keyscan circuit (54) to interface to an external keypad matrix (80). In one embodiment, the data processor (50) has a first register (62) for driving data to rows of the keypad matrix (80), and a second register (63) for inputting signals from columns of the keypad matrix (80). A set of weak pullup elements (71) connected to the columns is always conductive. A set of strong pullup elements (75) connected to the columns is conductive only after the hardware keyscan circuit (54) detects that a key (89) is depressed and disables the driving of the rows. Thus, pullup time and power consumption are minimized. The hardware keyscan circuit (54) also includes a data direction register (61) which has a shift control input terminal so that in response to a local state machine (64), the data direction register (61) acts as a shift register to sense the row with the depressed key (89), without intervention from a central processing unit (51).

20 Claims, 7 Drawing Sheets

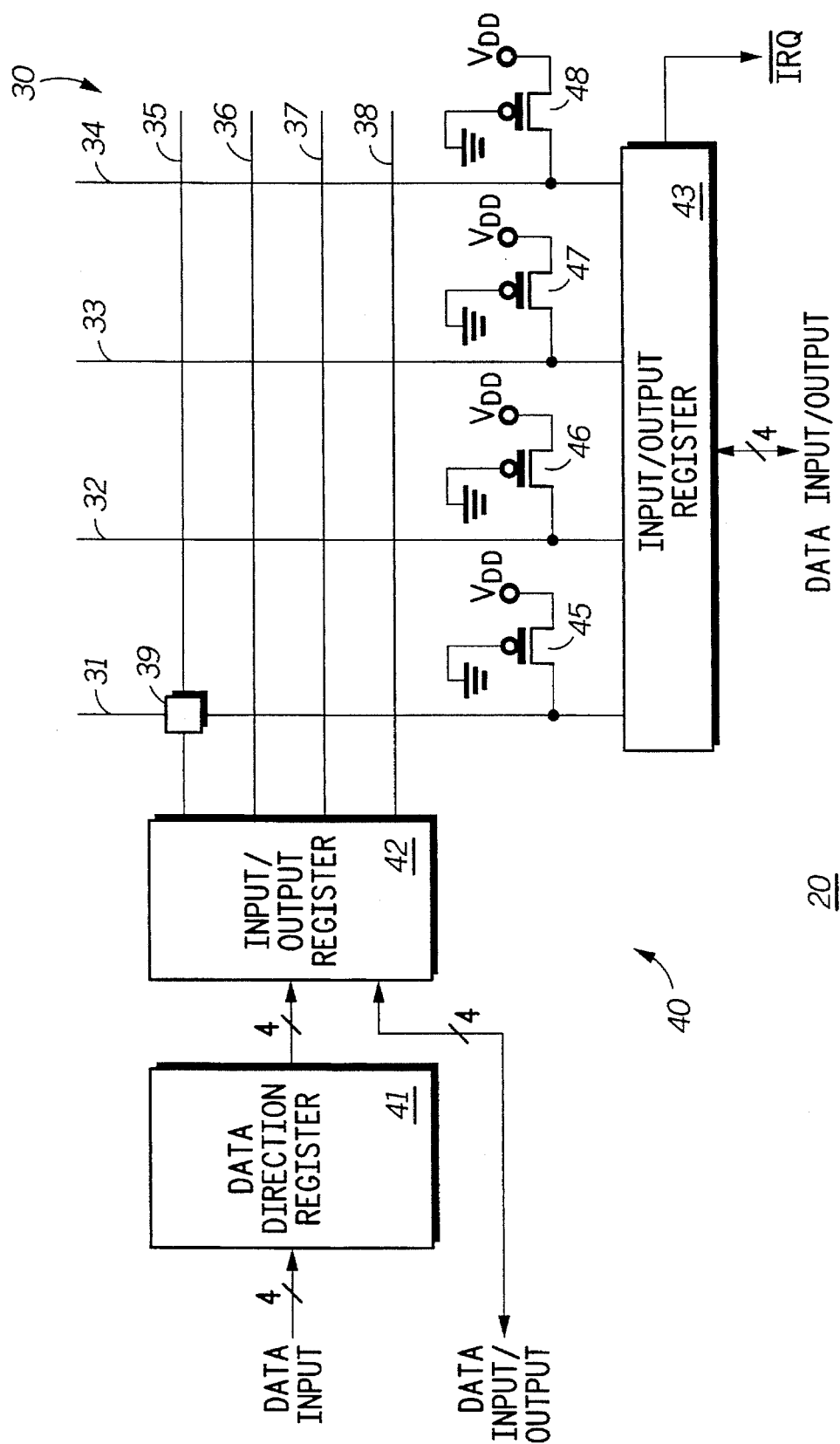
FIG.1 —PRIOR ART—

5,486,824

DATA PROCESSOR WITH A HARDWARE KEYSCAN CIRCUIT, HARDWARE KEYSCAN CIRCUIT, AND METHOD THEREFOR

FIELD OF THE INVENTION

This invention relates generally to data processors with input/output circuits, and more particularly, to data processors with keyscan circuits.

BACKGROUND OF THE INVENTION

Computer systems are classically defined as having a central processing unit, memory, and input/output devices. Recent advances in integrated circuit, technology have allowed many of the classical computer functions to be integrated onto a single integrated circuit chip. These devices are known by a variety of terms such as microcontrollers, embedded controllers, microcomputers, and the like. However, they share a common characteristic in that they incorporate most classical computer functions on-chip. Because of their high level of integration, microcontrollers are ideal for applications such as automobile engine controllers, refrigerators, cellular telephones, remote controllers, and the like.

It is frequently necessary for an application using a microcontroller to have a discrete human interface input/output device in the form of a keypad. A keypad is formed by a set of keys, usually in a square or matrix form. Keys are located at the intersection of rows and columns. Each of the rows and each of the columns has a conductor associated with it. When a key is pressed, the conductors forming the intersection associated with the depressed key are mechanically contacted, forming an electrical connection.

One frequently-encountered keypad is the telephone keypad using the North American dual tone multi-frequency (DTMF) signalling system. Under this system, the keys are arranged in a matrix. When a key is pressed, a dual tone is transmitted. This dual tone consists of one tone in a low frequency band corresponding to the row of the depressed key, and one tone in a high frequency band corresponding to the column of the depressed key. An ideal microcontroller for use in such a product needs to efficiently interface to the keypad with a minimum of circuit area and power consumption.

There are two general types of known keypad interfaces used in microcontrollers. The first type uses existing registers and software. One input/output port is defined as an output port, and is connected to the rows of the keypad. Another port is defined as an input port and is connected to the columns of the keypad. First, the output port is set to a predefined pattern, such as all zeros, corresponding to a logic low state. When a key is pressed, this logic low state is transferred to the columns and the column with the depressed key is sensed by the input port. The row of the depressed key is determined by "walking" a high impedance state by selectively disabling the driving of a row. This approach results in a tradeoff between speed and the high power consumption required by pullup resistors that could quickly convert the high impedance level to a logic high level.

The second approach uses a programmable keyscan circuit. In general, this approach is not as flexible as the software approach. For example, the keyscan circuit may not be able to support some modes that are occasionally needed, such as the ability to detect multiple keys. It also requires dedicated keyscan registers, increasing integrated circuit area and die cost.

What is needed, then, is a microcontroller with a keypad interface which consumes a small amount of power, with a small increase in circuit area, and which has the flexibility to detect multiple keys. Such a microcontroller is provided by the present invention, and these and other features and advantages will be more clearly understood from the following detailed description taken in conjunction with the accompanying drawings.

DETAILED DESCRIPTION OF A PREFERRED EMBODIMENT

Figures 1, 6:
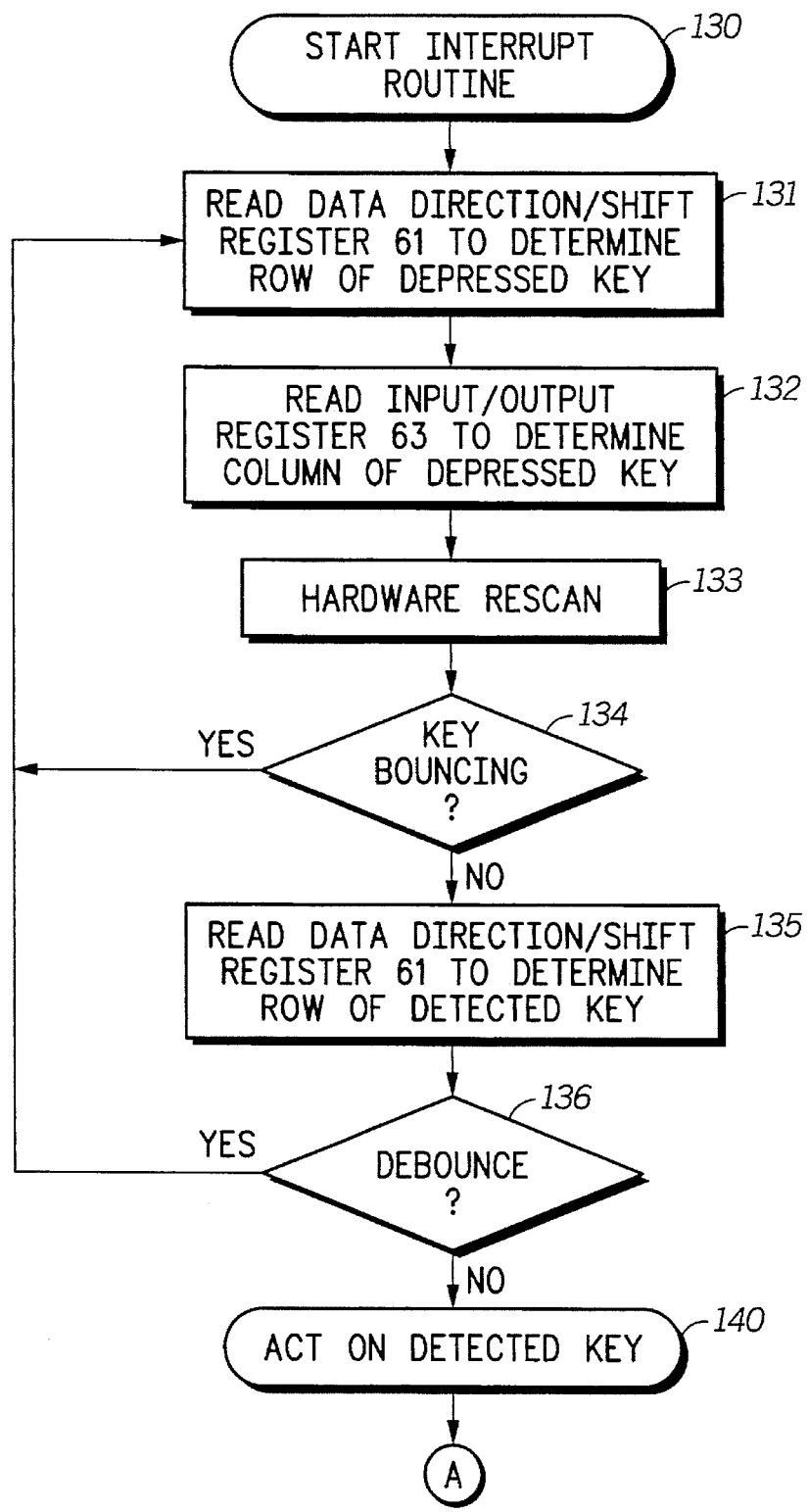
FIG. 1 illustrates in partial block diagram and partial schematic form a keyscan circuit according to the prior art.
FIG. 6 illustrates a flow chart associated with the handling of an interrupt generated by the hardware keyscan circuit of FIG. 2.
Figures 2, 6:
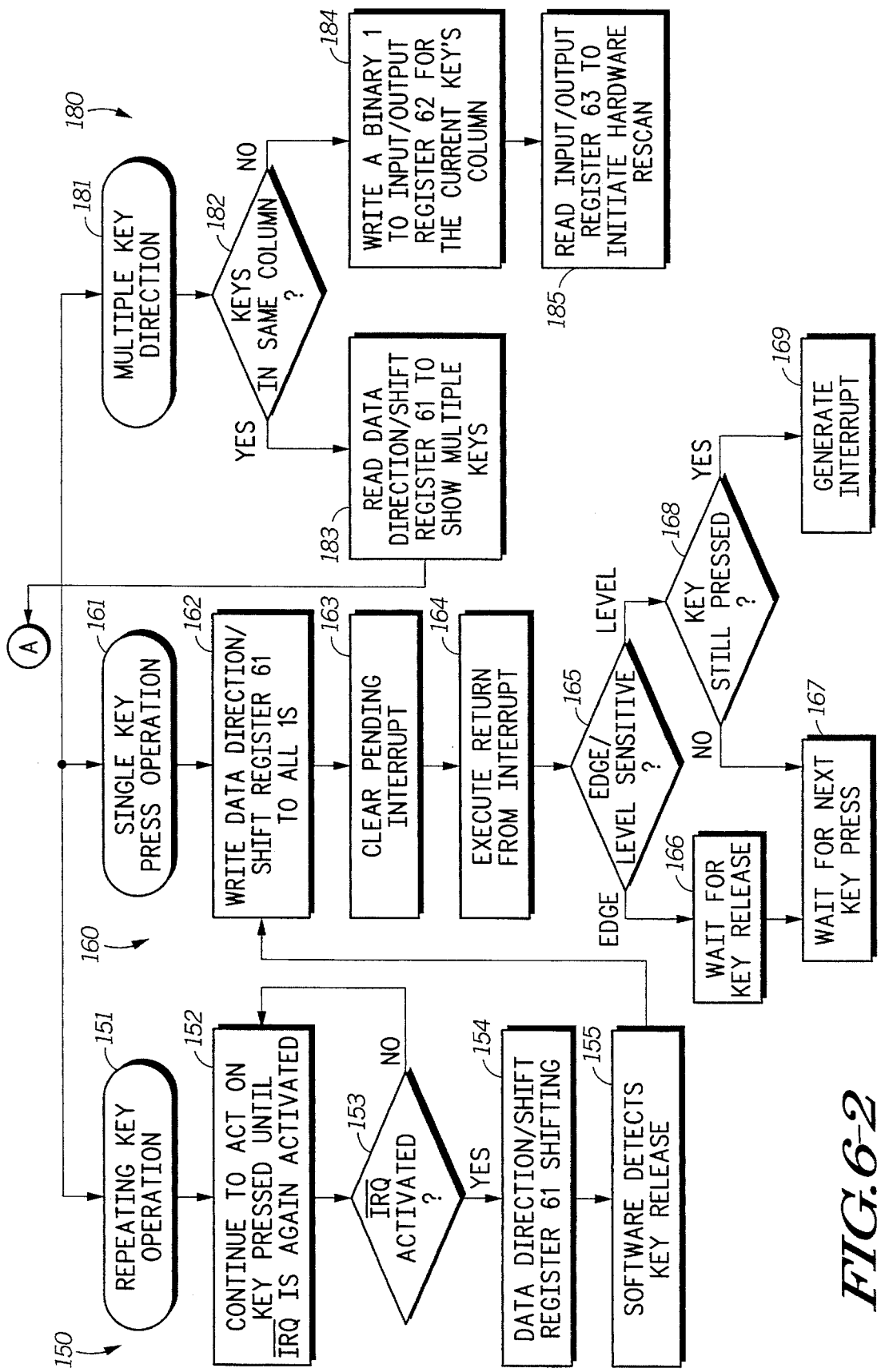

FIG. 1 illustrates in partial block diagram and partial schematic form a keyscan circuit 40 according to the prior art. Keyscan circuit 40 is illustrated in the context of a keypad system 20 which also includes a keypad matrix 30. Keypad matrix 30 is a conventional keypad matrix. In the illustrated embodiment, keypad matrix 30 includes a four-by-four array of rows and columns. For example, keypad matrix 30 could represent a dual tone multi-frequency (DTMF) keypad used in North American telephony. Keypad matrix 30 includes four columns, 31, 32, 33, and 34 crossing four rows, 35, 36, 37, and 38. A key is located at the intersection of each row and column. FIG. 1 illustrates a representative key 39 at the intersection of column 31 and row 35. When a key such as key 39 is pressed, the row is connected to the column and the depression of the key may be sensed in a manner described below.

Keyscan circuit 40 includes a data direction register 41, an input/output register 42, an input/output register 43, and P-channel metal oxide semiconductor (MOS) transistors 45, 46, 47, and 48. Data direction register 41 has an input terminal for receiving a 4-bit signal labeled "DATA INPUT", and an output terminal, and stores four bits representative of the direction (input or output) of corresponding bits in input/output register 42. Data direction register 41 has a four-bit output for providing these four bits to input/output register 42. Input/output register 42 also has a first bidirectional data terminal for conducting bidirectional data labelled "DATA INPUT/OUTPUT", and a second 4-bit bidirectional data terminal connected to the rows of keypad matrix 30, namely rows 35, 36, 37 and 38. Typically, the DATA/INPUT and DATA INPUT/OUTPUT signals will be conducted on a common bus with controls signals, not shown, enabling the writing of data into data direction register 41 and the reading or writing of data from or to input/output register 42.

Input/output register 43 has an input connected each of the columns in keypad matrix 30, namely columns 31, 32, 33, and 34. Input/output register 43 also has a bidirectional terminal for conducting DATA INPUT/OUTPUT. In addition, input/output register 43 has an output for providing an interrupt request signal labeled $\overline{IRQ}$. Transistor 45 has a source connected to a power supply voltage terminal labeled "$V_{DD}$", a gate connected to a power supply voltage terminal labeled "$V_{SS}$", and a drain coupled to column 31. $V_{DD}$ is a more positive power supply voltage terminal having a nominal value of approximately 5.0 volts. $V_{SS}$ is a more negative power supply voltage having a nominal value of approximately 0 volts. Transistor 46 has a source connected to $V_{DD}$, a gate connected to $V_{SS}$, and a drain connected to column 32. Transistor 47 has a source connected to $V_{DD}$, a gate connected to $V_{SS}$, and a drain connected to column 33. Transistor 48 has a source connected to $V_{DD}$, a gate connected to $V_{SS}$, and a drain connected to column 34.

In operation, data direction register 41 is initially programmed so that each of the four signal lines of input/output register 42 is configured to be an output. Furthermore, input/output register 42 is initially set to 0000 binary. Thus, input/output register 42 provides logic low levels corresponding to binary zeros to rows 35, 36, 37, and 38. Transistors 45, 46, 47, and 48 serve to pull their corresponding columns 31, 32, 33, and 34 to substantially $V_{DD}$. Thus, input/output register 43 senses a logic high voltage due to the action of transistors 45, 46, 47, and 48. However, the output buffer of input/output register 42 overdrives the corresponding column's pullup transistor to cause input/output register 43 to recognize a logic low level on a column with an activated key. In response, input/output register 43 activates signal $\overline{IRQ}$ to signal an interrupt condition to a host data processor.

For example, consider key 39 being pressed. If key 39 is pressed, the location of the intersection of row 35 and column 31 is indicated. During the first part of the keyscan operation, the logic low level provided by input/output register 42 on row 35 overdrives the logic high level of transistor 45, and input/output register 43 detects a logic low level on column 31. For this operation, there is a tradeoff between speed and power consumption. If transistors 45–48 are relatively weak, then they consume a smaller amount of static power when a key is pressed, but also have a longer to pullup time.

At this point it is possible to determine the row in column 31 of the depressed key. This operation is accomplished by "walking" a high impedance level through each row until the column again transitions to a logic high, and proceeds as follows. Data direction register 41 is programmed to have a binary zero in only one bit position, with binary ones in other bit positions. This pattern configures input/output register 42 to drive zeros to all bit positions except the one corresponding to the binary zero. Input/output register 43 then detects the logic level on each column. For example, input/output register 42 is programmed to have a 1110 pattern, corresponding to rows 35, 36, 37, and 38, respectively. Since the depressed key is located in row 35, therefore, input/output register 43 will detect a transition to a logic high level only after it has been programmed to have a zero in the bit position corresponding to the depressed key. This occurs when finally the pattern 0111 is provided to rows 35, 36, 37, and 38, respectively.

The main problem with this approach results from the keypad's relatively large resistance and capacitance. Input/output register 43 does not detect the low-to-high transition on the column until the pullup resistor raises the voltage above the logic high level. The low-to-high switching time is related to the resistance-capacitance (RC) time constant of the row and size of the pullup transistor. This switching time may be reduced by increasing the strength of the pullup transistors by increasing their gate width to gate length ratio ("W/L"). However, increasing the W/L increases power consumption when input/output register 42 drives a logic low. In some applications powered by a battery such as a cellular telephone, this extra power drain significantly decreases battery life.

Figure 2:
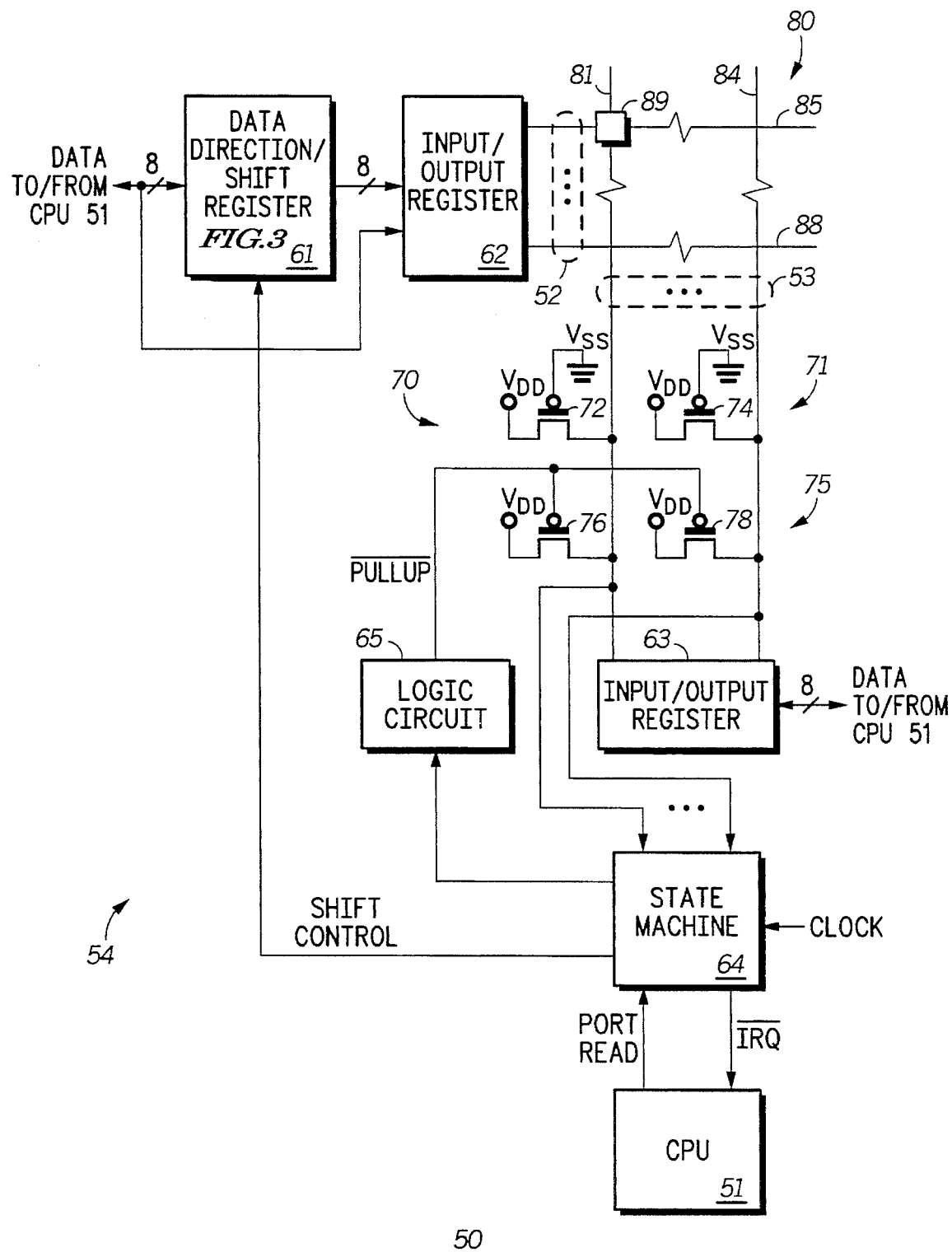
FIG. 2 illustrates in partial block diagram and partial schematic form a data processor with a hardware keyscan circuit according to the present invention.

FIG. 2 illustrates in partial block diagram and partial schematic form a data processor 50 with a hardware keyscan circuit 54 according to the present invention. Data processor 50 is a microcontroller integrated onto a single piece of silicon and includes generally a central processing unit (CPU) 51, a first bidirectional input/output port 52, a second bidirectional input/output port 53, and hardware keyscan circuit 54. CPU 51 is a central processing unit of data processor 50 and may be any kind of known data processor, such as a complex instruction set computer (CISC), a reduced instruction set computer (RISC), a digital signal processor (DSP), or the like. CPU 51 executes instructions according to a program stored in memory (not shown in FIG. 2) and is capable of receiving and responding to interrupts. For this purpose, CPU 51 has an input terminal for receiving interrupt request signal $\overline{IRQ}$. CPU 51 also provides control signals for accessing memory, not shown, and a signal labelled "PORT READ" which is a control signal generated upon an access to a location in its memory map occupied by input/output register 63.

Input/output ports 52 and 53 are conventional programmable input/output ports available in integrated circuit microprocessors or microcontrollers and are generally programmable as to use or function, as is well known in the art. Input/output ports 52 and 53 represent integrated circuit pins, and conventionally include electrostatic discharge (ESD) circuitry, which is omitted from FIG. 2 for ease of illustration.

Hardware keyscan circuit 54 includes a data direction/shift register 61, an input/output register 62, an input/output register 63, a state machine 64, and a logic circuit 65. Data direction/shift register 61 has an 8-bit parallel bidirectional terminal connected to CPU 51 for conducting a data byte labelled "DATA", a control input terminal for receiving a set of four signals labelled "SHIFT CONTROL", and an 8-bit output terminal. Input/output register 62 has a direction input terminal connected to the output terminal of data direction/shift register 61, a first bidirectional data terminal connected to CPU 51 for conducting DATA, and a second bidirectional data terminal connected to input/output port 52. Data direction/shift register 61 determines whether the eight bits of input/output register 62 function as inputs or outputs on a bit-by-bit basis. A binary 1 in a bit position in data direction/shift register 61 indicates that the corresponding bit in input/output register 62 is to function as an output. A binary 0 in a corresponding bit position in data direction/shift register 61 indicates that the corresponding bit in input/output register 62 is to function as an input. When a pin is configured as an input, the corresponding output buffer of input/output register 62 is placed in a high impedance state so that input/output register 62 does not drive any level to a corresponding row. It should be noted that input/output register 62 includes the functions of register data direction logic, input buffers, and output buffers.

In the illustrated embodiment, CPU 51 is a 6805-family microprocessor available from Motorola, Inc. The bits of port 53 are inverted by a set of eight inverters which are not shown in FIG. 2. These inverters cause a logic low sensed on the particular column to be stored as a logic high in input/output register 63. This inversion is important to allowing an efficient polling routine using the branch on equal to zero ("BEQ") instruction available in the 6805 instruction set. The software remains in a tight loop which loads the value of input/output register 63 into a register and then branches back to the beginning of the loop if all zeros are detected.

Input/output register 63 has a first 8-bit bidirectional data terminal connected to CPU 51 for conducting DATA, and a second 8-bit bidirectional data terminal connected to columns in keypad matrix 80 such as representative columns 81 and 84. Input/output register 63 also has a data direction input terminal for being connected to an output terminal of a corresponding data direction register. However, in the illustrated embodiment, input/output register 63 is used only as an input register and its function as an output register will not be further discussed.

State machine 64 has an input terminal connected to the columns in keypad matrix 80 through input/output port 53, a clock input terminal for receiving a signal labelled "CLOCK", a control input terminal for receiving the PORT READ signal from CPU 51, a first output terminal for providing the SHIFT CONTROL signals to data direction/shift register 61, and a second output terminal connected to a logic circuit 65. Logic circuit 65 also has an output terminal for providing a signal labeled "$\overline{\text{PULLUP}}$".

Pullup section 70 includes a set 71 of eight weak P-channel transistors such as representative transistors 72 and 74, and a set 75 of eight strong P-channel transistors 75 such as representative transistors 76 and 78. Transistor 72 has a source connected to $V_{DD}$, a gate connected to $V_{SS}$, and a drain connected to column 81. Transistor 74 has a source connected to $V_{DD}$, a gate connected to $V_{SS}$, and a drain connected to column 84. Transistors 72 and 74 are relatively weak devices. That is, the W/L ratio is such that transistors 72 through 74 conduct a relatively small amount of current compared to corresponding devices in the output buffer of input/output register 62.

Transistor 76 has a source connected to $V_{DD}$, a gate for receiving signal $\overline{\text{PULLUP}}$, and a drain connected to column 81. Transistor 78 has a source connected to $V_{DD}$, a gate for receiving signal $\overline{\text{PULLUP}}$, and a drain connected to column 84. Transistors 76 and 78 are relatively strong devices. That is, their W/L ratio is such that they conduct a relatively large amount of current compared to corresponding transistors in weak transistor set 71. The W/L is chosen to minimize pullup time without creating electromagnetic interference problems in adjacent circuitry.

Keypad matrix 80 is an 8-by-8 keypad matrix, having a total of sixty-four key positions at the intersection of each row and column. FIG. 2 illustrates representative rows 85 and 88 and representative columns 81 and 84. However, it should be apparent that the present invention applies to a keyscan circuit of arbitrary size. Also, it should be noted that input/output registers 62 and 63 may be part of the same physical register.

In overall operation, hardware keyscan circuit 54 provides two advantages. First, when a key is pressed such as key 89, input/output register 63 detects a change in logic state on column 81. In response to this change in logic state, state machine 64 activates its output to logic circuit 65. Logic circuit 65 then activates signal $\overline{\text{PULLUP}}$ to cause the relatively strong transistors in set 75 to become conductive. At the same time, state machine 64 resets all bits in data direction/shift register 64 to function as inputs, placing corresponding output buffers in input/output register 62 in a high impedance state. When state machine 64 detects that the strong transistors have caused all the columns to transition to a logic high, it deactivates its output to logic circuit 65 to make the strong transistors nonconductive. For example, transistor 76 helps columns 81 achieve its steady-state value in a relatively short period of time. After column 81 is pulled up to a logic high state, state machine 64 inactivates its output provided to logic circuit 65 which, in turn, deactivates signal $\overline{\text{PULLUP}}$. Thus, relatively large transistors in set 75 are active for only a short amount of time.

The W/L ratios of transistors in weak set 71 and strong set 75 will depend on the size of keypad matrix 80, which will vary from embodiment to embodiment. However, it is important that transistors in strong set 75 are sized with a W/L to be greater than corresponding transistors in weak set 71.

Hardware keyscan circuit 54 also improves the row and column sensing operation over known keyscan circuits. Upon the detection of the change in logic state in a column, that is, a change from a logic high to a logic low state, state machine 64 controls the shifting of a data pattern through data direction/shift register 61. Until detecting such a change, state machine 64 does not affect the operation of data direction/shift register 61. This data pattern includes eight bits in which only a single bit is set to a binary 1, with all other bit positions set to binary 0s. Thus, data direction/shift register 61 configures only a single bit of input/output register 62 to be configured as an output. Since input/output register 62 is storing all binary 0s, the bit configured as an output will drive a logic low corresponding to the binary 0. All other pins, by being configured as inputs, will not drive any logic levels to their corresponding rows. Thus, weak transistors 71 will cause input/output register 63 to recognize these columns in the logic high state.

State machine 64 sequentially shifts the binary 1 into successive bit positions until it detects a transition from a logic high to a logic low. At that point, state machine 64 stops the shifting operation and data direction/shift register 61 contains a value that corresponds to the row with the depressed key. For example, if key 89 were pressed, state machine 64 would control the shifting of eight bits having a single binary 1, with other bits at a binary 0, until the binary pattern corresponding to the active key occurs. When the binary 1 is shifted into row 85, state machine 64 detects a key being pressed. In response to state machine 64 signalling a further interrupt via the $\overline{\text{IRQ}}$ signal line, CPU 51 reads a binary 1 in the bit position in data direction/shift register 61 corresponding to row 85, and determines that key 89 has been depressed.

Hardware keyscan circuit 54 allows detection of multiple keys in the same row in the same manner as keyscan circuit 40 because input/output register 63 stores the state of all columns. However, hardware keyscan circuit 54 also allows detection of multiple keys in a single column. After a row with a depressed key is sensed, software programs the corresponding bit in input/output register 62 to be a binary 1. State machine 64 would not detect a key being pressed until the data pattern in data direction/shift register 61 corresponds to an additional depressed key.

Data processor 50 reduces power consumption over known keyscan interface circuits because state machine 64 enables the pullup transistors in strong set 75 only when needed. Also, the pullup transistors in strong set 75 are conductive only when input/output register 62 is not driving logic low voltages. Thus, only weak transistors 71 are continuously active.

The illustrated embodiment interfaces to an 8-by-8 keypad matrix. However, in other embodiments the keypad could be another size. For example, keypad matrix 80 could be a 4-by-4 DTMF keypad. In this case, input/output register 62 and input/output register 63 could be part of the same physical register, especially since 8-bit register sizes are common. However, it should also be apparent that a data processor with a hardware keyscan circuit according to the present invention could connect to a keypad matrix of arbitrary size.

Figure 3:
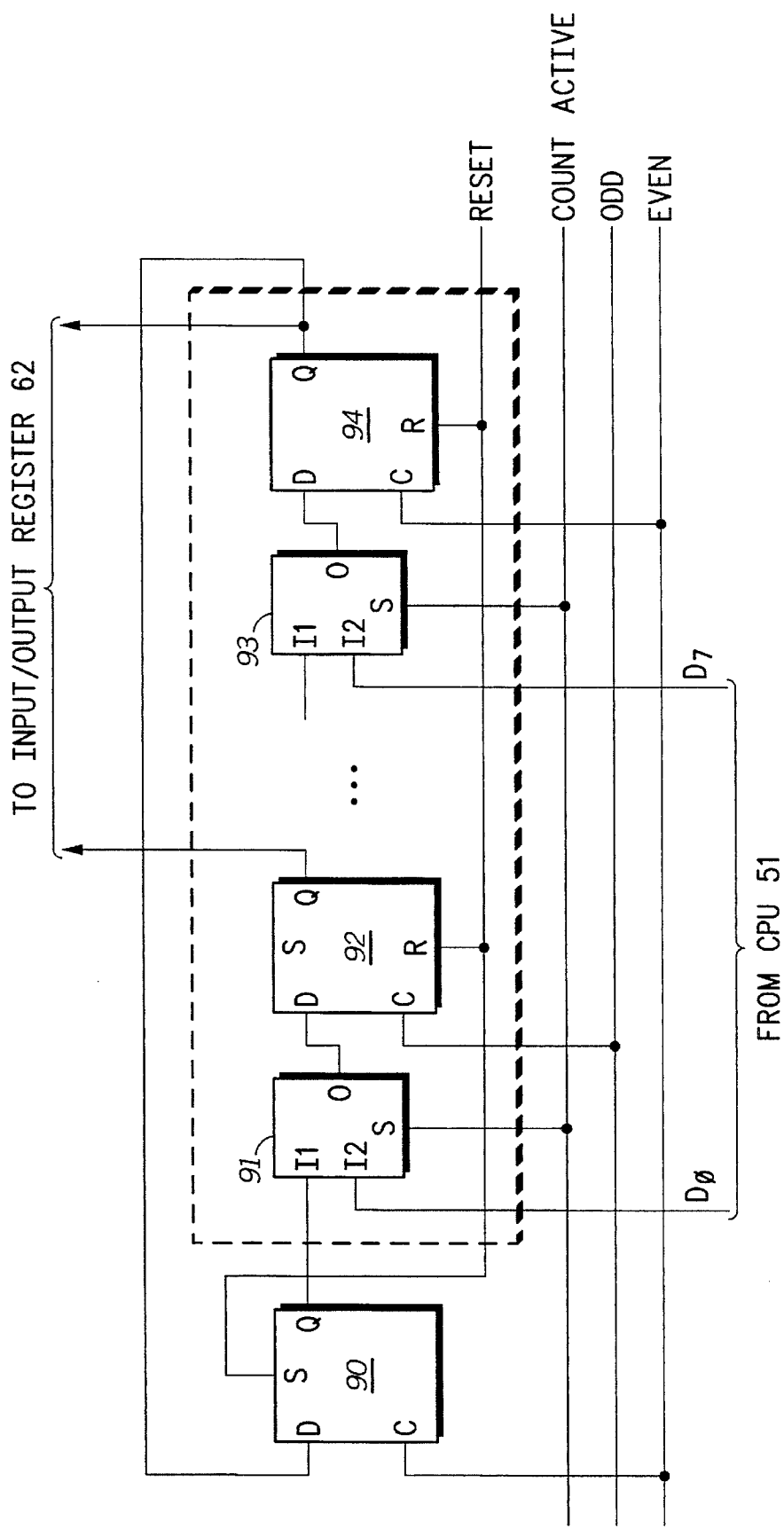
FIG. 3 illustrates in block diagram form the data direction/shift register of FIG. 2.

FIG. 3 illustrates in block diagram form data direction/shift register 61 of FIG. 2. Data direction/shift register 61 includes a latch 90, and one multiplexer (MUX) and one latch for each of the 8-bit positions in data direction/shift register 61. Illustrated in FIG. 3 are representative MUXes 91 and 93 and representative latches 92 and 94 corresponding to bit positions 0 and 7. The MUXes and latches for other bit positions are present in data direction/shift register 61, but are omitted for ease of illustration. Corresponding to bit position 0 is a MUX 91 and a latch 92. Corresponding to bit position 7 is a MUX 93 and a latch 94.

Latch 90 is a transparent latch having a data input labeled "D", a clock input labeled "C" for receiving a control signal labeled "EVEN", a set input terminal labeled "S" for receiving a signal labeled "RESET", and a true data output terminal labeled "Q". MUX 91 has a first input terminal labeled "I1" connected to the "Q" output terminal latch 90, a second input terminal labeled "I2" for receiving a data input signal from CPU 51 labeled "$D_O$", a select input terminal labeled S for receiving an input signal labeled "COUNT ACTIVE", and an output terminal labeled "O". Latch 92 has a D input terminal connected to the O output terminal of MUX 91, a C input terminal for receiving a control signal labeled "ODD", a reset input terminal labelled "R" for receiving signal RESET, and a Q output terminal for providing an output signal to a corresponding bit of input/output register 62. The Q output terminal of latch 92 is connected to the I1 input terminal of a MUX associated with bit position 1, and so on. MUX 93 has I1 input terminal connected to the Q output terminal of a latch associated with bit position 6, an I2 input terminal for receiving a data input signal label "$D_7$", an S input terminal for receiving signal COUNT ACTIVE, and an O output terminal. Latch 94 has a D input terminal connected to the O output terminal of MUX 93, a C input terminal for receiving signal EVEN, an R input terminal for receiving signal RESET, and a Q output terminal connected to the D input terminal of latch 90 and providing an output to a corresponding bit of input/output register 62. The MUXes and latches for each bit position not shown are connected similarly to those of MUXes 91 and 93 and latches 92 and 94, except that the C input terminal of latches not shown are connected to signals ODD and EVEN in an alternating fashion.

In operation, data direction/shift register 61 includes not only latches for the 8-bit positions as in a conventional register, but also a set of MUXes to allow a data bit to be shifted through data direction/shift register 61. This allows the determination of the active row to be done in hardware without intervention from CPU 51, however, with only a very small increase in circuit area. When signal RESET is activated, latch 90 is preset to a "1" state and each of the other latches, such as the representative latches 92 and 94 are reset to a "0" state. Signal COUNT ACTIVE is in an active state, causing the MUXes in data direction/shift register 61 such as representative MUXes 91 and 93 to select the first inputs thereof. Signals ODD and EVEN are clock signals active during the row sensing operation on alternative half phases of signal CLOCK to shift the binary 1 initially stored in latch 90 through successive bit positions of data direction/shift register 61, with zeroes filling the other bit positions. Thus, data direction/shift register 61 activates only one of its output signals to input/output register 62, configuring only one bit position of input/output register 62 as an output, with other bit positions in the high impedance state.

Figure 4:
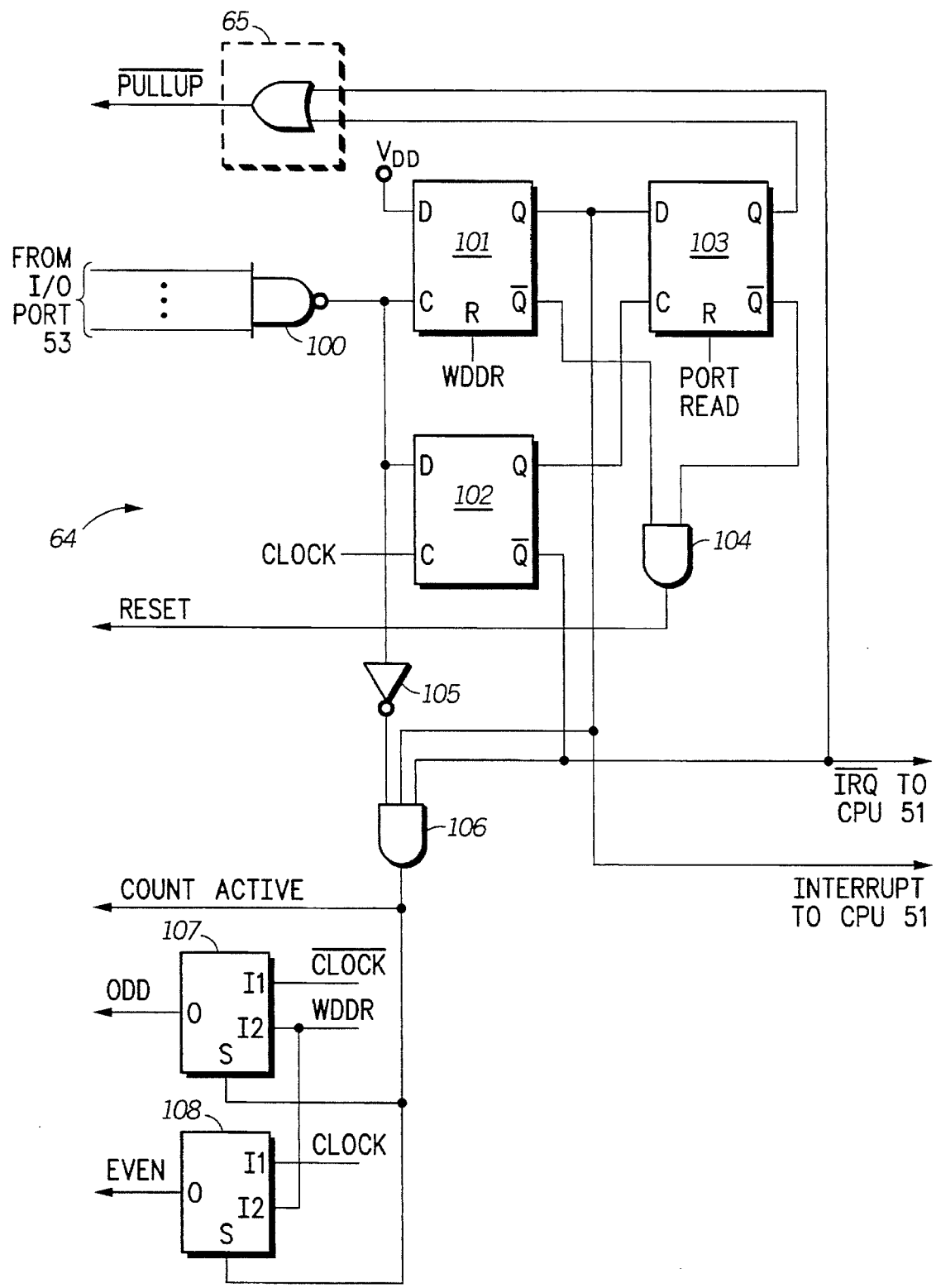
FIG. 4 illustrates in partial block and partial logic diagram form the state machine and logic circuit of FIG. 2.

FIG. 4 illustrates in partial block and partial logic diagram form state machine 64 and logic circuit 65 of FIG. 2. State machine 64 includes generally a NAND gate 100, D-type flip flop 101, 102, and 103, an AND gate 104, an inverter 105, an AND gate 106, and MUXes 107 and 108. NAND gate 100 is an 8-input NAND gate, with each input connected to a corresponding column of input/output port 53. Thus, NAND gate 100 provides an output at a logic high if any one of its inputs are at a logic low, signifying the depression of at least one key in keypad matrix 80. D-type flip flop 101 has a D input connected to $V_{DD}$, a C input connected to the output of NAND gate 100, an R input for receiving a signal labeled "WDDR", a Q output terminal, and a $\overline{Q}$ output terminal. Signal WDDR is a control signal received from CPU 51 to indicate that a write operation to data direction/shift register 61 is to be performed. Flip flop 102 has a D input terminal connected to the output terminal of NAND gate 100, a C input terminal for receiving signal CLOCK, a Q output terminal, and a $\overline{Q}$ output terminal for providing signal $\overline{IRQ}$ to CPU 51. Flip flop 103 has a D input terminal connected to the Q output terminal of flip flop 101, a C input terminal connected to the Q output terminal of flip flop 102, an R input terminal for receiving signal PORT READ, a Q output terminal, and a $\overline{Q}$ output terminal. AND gate 104 has a first input terminal connected to the $\overline{Q}$ output terminal of flip flop 101, a second input terminal connected to the $\overline{Q}$ output terminal of flip flop 103, and an output terminal for providing signal RESET. Inverter 105 has an input terminal connected to the output terminal of NAND gate 100 and an output terminal. AND gate 106 has a first input terminal connected to the output terminal of inverter 105, a second input terminal connected to the Q output terminal of flip flop 101, a third input terminal connected to the $\overline{Q}$ output terminal of flip flop 102, and an output terminal for providing signal COUNT ACTIVE. MUX 107 has a first input terminal for receiving a compliment of signal CLOCK labeled $\overline{CLOCK}$, a second input terminal for receiving signal WDDR, a select input terminal connected to the output terminal of AND gate 106, and an output terminal for providing signal ODD. Flip flop 108 has an I1 input terminal for receiving signal CLOCK, an I2 input terminal for receiving signal WDDR, an S input terminal connected to the output terminal of AND gate 106, and an O output terminal for providing signal EVEN. Logic circuit 65 includes an OR gate having a first input terminal connected to the Q output terminal of flip flop 103, a second input terminal connected to the Q bar output terminal of flip flop 102, and an output terminal for providing signal $\overline{PULLUP}$.

Figure 5:
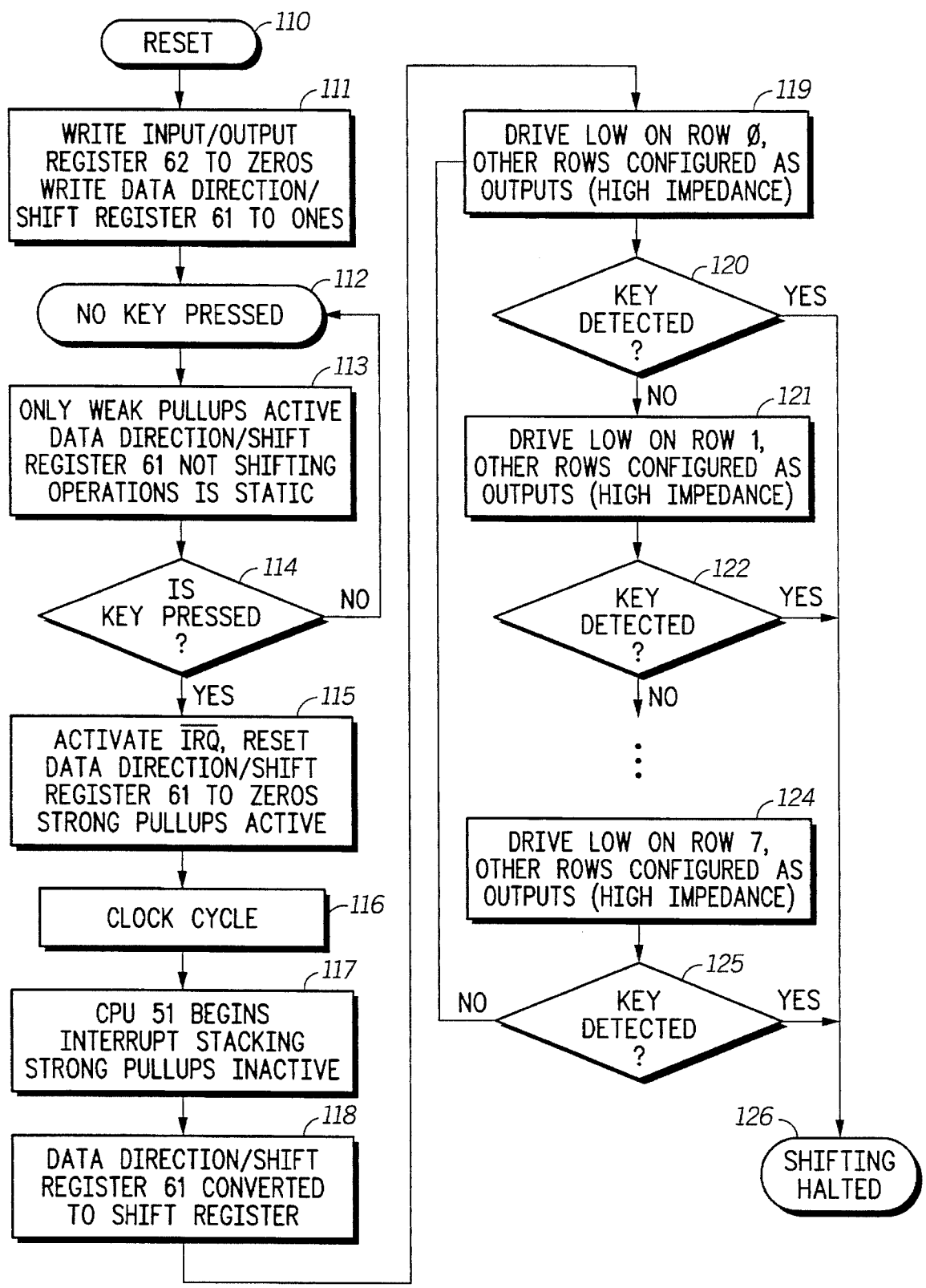
FIG. 5 illustrates a flow chart associated with the operation of the hardware keyscan circuit of FIG. 2.

The operation of hardware keyscan circuit 54 may be better understood with reference to FIG. 5, which illustrates a flow chart associated with the operation of hardware keyscan circuit 54 FIG. 2. Initially, hardware keyscan circuit 54 is in a reset state 110. Subsequently at step 111, software writes input/output register 62 to all binary 0s, and data direction/shift register 61 to all binary 1s, thus causing each bit position of input/output register 62 to output 0s. State 112 corresponds to a state in which no key is pressed. In other words, NAND gate 100 of state machine 64 provides its output in an inactive state at a logic low. Step 113 indicates that until the depression of a key is detected, only the weak pullup transistors 71 are active, data direction/shift register 61 is not shifting, and the operation is completely static. Hardware keyscan circuit 54 remains in this state while no key is pressed as detected by NAND gate 100 and illustrated in FIG. 5 as decision box 114.

However, after NAND gate 100 detects that a key has been depressed and flip flop 102 activates signal $\overline{IRQ}$ at step 115. AND gate 104 activates signal RESET, causing data direction/shift register 61 to output all zeroes to input/output register 62, placing all bit positions of input/output register 62 to be configured as inputs; in other words, to drive high impedance levels. Also, at step 115, strong pullup transistors 75 become active. After one CLOCK cycle at step 116, CPU 51 begins the interrupt stacking at step 117. At step 117 logic circuit 65 deactivates signal $\overline{PULLUP}$, making strong pullup transistors 75 nonconductive. Strong pullup transistors 75 are active only until the column with the depressed key has transitioned back to a logic high voltage, minimizing current drain.

Subsequently, at step 118 signal COUNT ACTIVE causes data direction/shift register 61 to become a shift register and walk a binary 1 through successive bit positions. This is illustrated as a succession of steps 119 through 125 which are illustrative of the shifting operation. At step 119 row 0 is driven to a logic low, with other rows in the high impedance state and thus pulled up to $V_{DD}$ through the operation of the weak pullup transistors. If a key depression is detected at step 120, then shifting is halted at step 126. If the depression of a key is not detected, then the operation continues to step 121 where the binary one is shifted into row 1, which input/output register 62 drives to a logic low level. The other rows are placed in the high impedance state and pulled up to $V_{DD}$ through the operation of the weak pullup transistors. At step 122, NAND gate 100 again detects whether a key has been pressed. This operation continues through all keys until the depression of a key is detected. The last row, row 7, is driven to a logic low at step 124. At this point, if a key is detected at step 125, the shifting is halted. However, if no key is detected, then the operation may be fully repeated starting with step 119. Note that FIG. 5 omits a timeout condition check step which would be required to prevent the software from continuously looping on steps 120–125 after noise cause a spurious detection of a key.

FIG. 6 illustrates a flow chart associated with the handling of an interrupt generated by hardware keyscan circuit 54 of FIG. 2. The interrupt handler routine begins at step 130. At step 131, data direction/shift register 61 is read to determine the row of the depressed key. At step 132, input/output register 63 is read to determine the column of a depressed key. Since a read of input/output register 63 causes CPU 51 to activate the PORT READ signal, this operation causes a hardware rescan to occur at step 133. Step 134 then determines whether a key is bouncing. If a key is bouncing, the rescan will fail to detect a depressed key. In this case, the flow is repeated starting with step 131. If no bouncing key is detected, then at step 135, data direction/shift register 61 will again be read to determine the row of the depressed key. At step 136, if a debounce has occurred, then the operation is repeated starting with step 131. Otherwise, software then proceeds to act on the detected key at step 140.

Three types of key operations can be performed, including a repeating key operation indicated by a series of steps labeled 150, a single key press operation indicated by a series of steps 160, and multiple key detection indicated by a series of steps 180. Step 151 represents the start of a repeating key operation. At step 152 software continues to act on the key that was detected until state machine 64 again activates signal $\overline{IRQ}$. When signal $\overline{IRQ}$ is detected in a logic low state, the flow continues to step 154 which repeats the shifting operation through data direction/shift register 61 until at step 155, the software detects a key release. After step 155, the flow continues as in the single key operation at step 162 thereof.

A single key press operation causes the interrupt routine to be exited at state 161 by the following steps. Step 162 writes data direction/shift register 61 to binary 1s to configure input/output register 62 to be all outputs. At step 163, the pending interrupt is cleared and at step 164, a return from interrupt (RTI) instruction is generated causing CPU 51 to fetch the pre-interrupt information off the stack. The software at this point determines whether the key press is to be level or edge sensitive. If edge sensitive, at step 166 the software waits for a key release and when the key release is detected, proceeds to step 167 which waits for the next key to be pressed. If level sensitive, at step 168 software detects whether the key is still pressed. If not, it flows to step 167 to wait for the next key press, or if the key is still pressed, proceeds to step 169 to generate a further interrupt.

The multiple key detection flow proceeds as follows, beginning with state 181. At step 182, software detects whether the multiple keys are in the same column. If so, at step 183 a read of input/output register 63 will show multiple keys in one column and flow returns to step 140. If not, at step 144, a binary 1 is written to input/output register 62 to prevent that row from influencing the detection of a second row. Then at step 185 software reads input/output register 63, causing an activation of the PORT READ signal to again begin a rescan.

While the invention has been described in the context of a preferred embodiment, it will be apparent to those skilled in the art that the present invention may be modified in numerous ways and may assume many embodiments other than that specifically set out and described above. For example, the hardware keyscan circuit may be used with a variety of data processing devices such as microprocessors, microcontrollers, single-chip microcontrollers, embedded controllers, finite state machines, and the like. The data processing devices may either be integrated with the hardware keyscan circuit in a single integrated circuit, or located off-chip. Furthermore, the keyscan circuit may be of arbitrary size. Also, the input/output registers may be part of the same physical register. The software routine illustrated in FIG. 6 is just one of many possible software routines for key detection. A keyscan circuit according to the present invention is not limited to five-volt systems. The logic state used to define an output signal in the data direction/shift register is also arbitrary. Accordingly, it is intended by the appended claims to cover all modifications of the invention which fall within the true spirit and scope of the invention.

We claim:

1. A data processor with a hardware keyscan circuit, comprising:

a central processing unit;

a first register coupled to said central processing unit and to a first port for being coupled to a plurality of rows of a keypad matrix;

a second register coupled to said central processing unit and to a second port for being connected to a plurality of columns of said keypad matrix;

a first plurality of pullup elements coupled to corresponding ones of said plurality of columns, said first plurality of pullup elements characterized as being continuously conductive;

a second plurality of pullup elements coupled to corresponding ones of said plurality of columns, said second plurality of pullup elements characterized as being conductive in response to a pullup signal; and a pullup control circuit having an input coupled to said second register, and an output coupled to said second plurality of pullup elements for activating said pullup signal in response to a change of logic state of at least one of said plurality of columns.

2. The data processor of claim 1 wherein said pullup control circuit is coupled to said central processing unit and provides an interrupt request signal to an interrupt request input of said central processing unit in response to said change of logic state of said at least one of said plurality of columns.

3. The data processor of claim 2 further comprising a data direction register coupled to said central processing unit having an input coupled to said central processing unit, a control input coupled to said pullup control circuit, and an output coupled to a data direction input said first register.

4. The data processor of claim I wherein each pullup element of said second plurality of pullup elements comprises a P-channel transistor having a source coupled to a first power supply voltage terminal, a gate for receiving said pullup signal, and a drain coupled to a corresponding one of said plurality of columns.

5. The data processor of claim 4 wherein each of said first plurality of pullup elements comprises a P-channel transistor having a source coupled to a first power supply voltage terminal, a gate coupled to a second power supply voltage terminal, and a drain coupled to a corresponding one of said plurality of columns.

6. The data processor of claim 5 wherein a gate width-to-length ratio of each of said first plurality of pullup elements is characterized as being smaller than a gate width-to-length ratio of a corresponding one of said second plurality of pullup elements.

7. A data processor with a hardware keyscan circuit, comprising:

a central processing unit;

a data direction register having a data input/output terminal coupled to said central processing unit, a control input terminal for receiving a shift control signal, and an output terminal, said data direction register shifting each of a plurality of data direction bits to an adjacent bit position in response to an activation of said shift control signal;

a first input/output register having a first terminal coupled to said central processing unit, a data direction input terminal coupled to said output terminal of said data direction register, and a second terminal coupled to a first port for being connected to a plurality of rows of a keypad matrix;

a second register having a first terminal coupled to said central processing unit, and a second terminal coupled to a second port for being connected to a plurality of columns of said keypad matrix; and a state machine having an input terminal coupled to said second port, and an output terminal coupled to said control input terminal of said data direction register for providing said shift control signal;

said state machine controlling said data direction register to shift sequentially a predetermined logic value through bit positions of said data direction register in response to a first transition of at least one bit of said second port until a second transition of said at least one bit of said second port.

8. The data processor of claim 7 wherein said data direction register comprises:

a plurality of storage elements and a like plurality of multiplexers corresponding to bits of said data input/output terminal of said data direction register;

each of said plurality of storage elements having a data input terminal, a clock input terminal coupled to said output terminal of said state machine, and an output terminal; and each of said like plurality of multiplexers having a first input terminal coupled to a data output terminal of a preceding one of said plurality of storage elements, a second input terminal coupled to a corresponding bit of said data input/output terminal of said data direction register, a control input terminal coupled to said output terminal of said state machine, and an output terminal coupled to a data input terminal of a corresponding one of said plurality of storage elements.

9. A hardware keyscan circuit, comprising:

a first register coupled to a first port for being coupled to a plurality of rows of a keypad matrix;

a second register coupled to a second port for being coupled to a plurality of columns of said keypad matrix;

a first plurality of pullup elements coupled to corresponding ones of said plurality of columns, said first plurality of pullup elements characterized as being continuously conductive;

a second plurality of pullup elements coupled to corresponding ones of said plurality of columns, said second plurality of pullup elements characterized as being conductive in response to a pullup signal; and a pullup control circuit having an input coupled to said second register, and an output coupled to said second plurality of pullup elements for activating said pullup signal in response to a change of logic state of at least one of said plurality of columns.

10. The hardware keyscan circuit of claim 9 4therein said pullup control circuit comprises a state machine for providing an interrupt request signal in response to said change of logic state of said at least one of said plurality of columns.

11. The hardware keyscan circuit of claim 10 further comprising a data direction register having an input for receiving a parallel data signal, a control input coupled to said pullup control circuit, and an output coupled to a data direction input said first register.

12. The hardware keyscan circuit of claim 9 wherein each pullup element of said second plurality of pullup elements comprises a P-channel transistor having a source coupled to a first power supply voltage terminal, a gate for receiving said pullup signal, and a drain coupled to a corresponding one of said plurality of columns.

13. The hardware keyscan circuit of claim 12 wherein each pullup element of said first plurality of pullup elements comprises a P-channel transistor having a source coupled to a first power supply voltage terminal, a gate coupled to a second power supply voltage terminal, and a drain coupled to a corresponding one of said plurality of columns.

14. The hardware keyscan circuit of claim 13 wherein a gate width-to-length ratio of each of said first plurality of pullup elements is characterized as being smaller than a gate width-to-length ratio of a corresponding one of said second plurality of pullup elements.

15. A hardware keyscan circuit, comprising:

a data direction register having a data input/output terminal for receiving a parallel data signal, a control input terminal for receiving a shift control signal, and an output terminal, said data direction register shifting each of a plurality of data direction bits to an adjacent bit position in response to an activation of said shift control signal;

a first input/output register having a first terminal for receiving a data input signal, a data direction input terminal coupled to said output terminal of said data direction register, and a second terminal coupled to a first port for being coupled to a plurality of rows of a keypad matrix;

a second register having a first terminal for providing a data output signal, and a second terminal coupled to a second port for being coupled to a plurality of columns of said keypad matrix; and a state machine having an input terminal coupled to said second terminal of said second register, and an output terminal coupled to said control input terminal of said data direction register for providing said shift control signal;

said state machine sequentially shifting a predetermined logic value through bit positions of said data direction register in response to a first transition of at least one bit of said second register until a second transition of said at least one bit of said second register.

16. The hardware keyscan circuit of claim 15 wherein said data direction register comprises:

a plurality of storage elements and a like plurality of multiplexers corresponding to bits of said data input/output terminal of said data direction register;

each of said plurality of storage elements having a data input terminal, a clock input terminal coupled to said output terminal of said state machine, and an output terminal; and each of said like plurality of multiplexers having a first input terminal coupled to a data output terminal of a preceding one of said plurality of storage elements, a second input terminal coupled to a corresponding bit of said data input/output terminal of said data direction register, a control input terminal coupled to said output terminal of said state machine, and an output terminal coupled to a data input terminal of a corresponding one of said plurality of storage elements.

17. A method for scanning a keypad matrix to determine a row and column location corresponding to a depressed key, comprising the steps of:

coupling each of a plurality of columns of the keypad matrix to a first power supply voltage terminal through a corresponding plurality of first conduction elements, said first power supply voltage terminal indicative of a first logic state;

coupling a second plurality of conduction elements between said plurality of columns and said first power supply voltage terminal;

driving each of a plurality of rows to a second logic state;

sensing a change of logic level from said first logic state to said second logic state in one of said plurality of columns; and activating said second plurality of conduction elements in response to said change in logic level.

18. The method of claim 17 further comprising the step of sensing when logic levels of all of said plurality of columns are again in said first logic state and deactivating said second plurality of conduction elements in response.

19. The method of claim 18 wherein said step of sensing when logic levels of all of said plurality of columns are again in said first logic state further comprises the step of disabling a driving of each of said plurality of rows to said second logic state.

20. The method of claim 17 wherein said step of coupling said second plurality of conduction elements between said plurality of columns and said first power supply voltage terminal comprises the step of coupling conduction paths of a plurality of P-channel transistors between said plurality of columns and said first power supply voltage terminal.

* * * * *

UNITED STATES PATENT AND TRADEMARK OFFICE
CERTIFICATE OF CORRECTION

PATENT NO. : 5,486,824
DATED : Jan. 23, 1996
INVENTOR(S) : Keith E. Kinerk, et al.

It is certified that error appears in the above-indentified patent and that said Letters Patent is hereby corrected as shown below:

Column 12, line 42, after "9" delete [4therein] and insert --wherein--.

Signed and Sealed this

Twenty-first Day of May, 1996

Attest:

BRUCE LEHMAN

*Attesting Officer*        *Commissioner of Patents and Trademarks*